United States Patent [19]

Kuehnle

[11] Patent Number: 5,343,234
[45] Date of Patent: Aug. 30, 1994

[54] DIGITAL COLOR PROOFING SYSTEM AND METHOD FOR OFFSET AND GRAVURE PRINTING

[76] Inventor: Manfred R. Kuehnle, P.O. Box 1020, Waldesruh, Rte. 103A, New London, N.H. 03257

[21] Appl. No.: 6,827

[22] Filed: Jan. 21, 1993

Related U.S. Application Data

[63] Continuation of Ser. No. 792,808, Nov. 15, 1991, abandoned.

[51] Int. Cl.$^5$ .............................................. G01D 15/06
[52] U.S. Cl. ................................... 346/159; 346/153.1
[58] Field of Search ....................... 346/153.1, 158, 159

[56] References Cited

U.S. PATENT DOCUMENTS

| | | | |
|---|---|---|---|
| 4,001,493 | 1/1977 | Cone | 346/158 X |
| 4,495,508 | 1/1985 | Tarumi et al. | 346/159 |
| 4,498,090 | 2/1985 | Honda et al. | 346/159 |
| 4,792,860 | 12/1988 | Kuehrle | 358/300 |
| 4,897,731 | 1/1990 | Kuehnle | 358/355 |
| 5,068,961 | 12/1991 | Nishikawa | 346/159 X |
| 5,122,663 | 6/1992 | Chang et al. | 346/158 X |
| 5,166,709 | 11/1992 | Kubelik | 346/158 X |

*Primary Examiner*—Benjamin R. Fuller
*Assistant Examiner*—Randy W. Gibson
*Attorney, Agent, or Firm*—Cesari and McKenna

[57] ABSTRACT

A proofing system incorporates an image member having a dielectric surface and a write head for writing a pattern of electrostatic image dots on the surface. A controller is provided for controlling the write head in response to digital data representing an original document so that the image dots of the pattern may have variable field strengths and form a latent electrostatic image of the document on the surface. The controller also controls the areas of the image dots written on the surface in accordance with the digital data. An inking head presents an electrostatic ink to the surface whereby the surface acquires ink only at the image dots thereon in amounts proportional to the field strengths of the image dots so as to develop the latent image on the surface. A printing substrate is supported and pressed against the image member surface so that the ink is released from the surface to the substrate thereby producing a proof copy of the original document consisting of a pattern of print dots with variable gray scale values and/or sizes so that the system may produce proof copies composed of patterns of dots which emulate the printing structure produced by an offset press or a gravure press.

15 Claims, 8 Drawing Sheets

DOTS OF VARIABE SIZE & EQUAL DENSITY

DOTS OF VARIABLE SIZE &
VARIABLE DENSITY

DIGITAL COLOR PROOFING SYSTEM AND METHOD FOR OFFSET AND GRAVURE PRINTING

RELATED APPLICATION

This application is a continuation of Ser. No. 07/792,808, filed Nov. 15, 1991, now abandoned.

This invention relates to a digital color proofing system. It relates more particularly to a proofing system which is capable of emulating both offset and gravure printing.

BACKGROUND OF THE INVENTION

A proofing system is an apparatus used to generate a relatively limited number of copies of print simulations to verify that the copies are up to specifications in terms of color, quality, scaling, etc. A variety of color proofing systems have been developed to emulate offset printing results. Separately, other systems with different image formation characteristics have been created to emulate rotogravure printing results. These two types of systems vary fundamentally in that the first type needs to print copies composed of variable size dots of equal ink density, whereas the latter type must produce continuous tone reproductions made up of dots which vary both in size and in density.

Since in modern color scanners and page composition installations most of the data bases exist in digital form, some considerable thought has been given to producing digital color proofing systems which can lay down the types of dot patterns which most closely resemble the image structure of the desired prints, whether they be offset prints of gravure prints. Indeed, a few systems of this kind are now on the market. Unfortunately, however, they do not emulate the two required image structures closely enough. Also, the systems are extremely complex, very slow and costly. Even so, none of them can even produce a color print on a plain sheet of press paper such as used by printers. In other words, the printed sheets produced by such systems either exist as photographic film, or feature multiple layer laminates, or they are made of a special sheet of plain paper which is subsequently overcoated with a transparentizing varnish to fix the image. This varnishing step, unfortunately, alters the appearance of the paper.

SUMMARY OF THE INVENTION

Accordingly, it is an object of the present invention to provide a digital color proofing system which can proof copies which closely emulate either offset or gravure printing.

Another object of the invention is to provide a system of this type which can produce proof copies on plain paper.

Further object of the invention is to provide a digital color proofing system which can produce images of unusually high resolution and quality.

Yet another object of the invention is to provide a system such as this which is relatively simple and easy to operate.

Another object of the invention is to provide the user with a compact, inexpensive machine which can produce a digital color copy in about one minute.

Other objects will, in part, be obvious and will, in part, appear hereinafter. The invention accordingly comprises the sequence of steps and the features construction, combination of elements and arrangement of parts to effect such steps which will be exemplified in the following detailed description, and the scope of the invention be indicated in the claims.

Briefly, my color proofing system comprises a print cylinder having a heated, dielectric, mildly ink phobic surface in rolling contact with a paper cylinder able to pick up and hold temporarily a standard paper sheet. Disposed around the print cylinder is a write station, an inking station capable of dispensing different color inks and an ink transfer station, the last of which is actually the nip of the two cylinders.

At the write station, a write head responding to incoming digital data images the print cylinder electronically as the cylinder rotates to create on the surface of that cylinder, an electrostatic charge pattern composed of charged image areas or dots which together define the image. In the case of color copies, the image may represent one color component of a color original. As the cylinders continue to rotate, this charge pattern is advanced to the inking station which supplies, selectively, the different color inks customarily used for subtractive color printing, e.g., cyan, magenta, yellow and, sometimes, black. Provisions may also be made for adding a fifth or top layer of a transparent "ink" or coating to form a protective overlay on the printed area of the proof. That station is controlled to position opposite the print cylinder surface, a supply of molten thermoplastic ink of the color which corresponds to the image then being written on the cylinder, e.g., cyan ink. As a recorded area on the print cylinder surface sweeps past the inking station, the field lines from the electrostatic charge domains or image dots comprising the latent image thereon extend momentarily toward the ink supply and take "bites" of liquid ink whose quantities are directly proportional to the field intensities of the charge domains. Thus, the print cylinder surface, despite its ink phobic nature, acquires varying quantities of ink at these image dots which are related to the field strengths at those dots thereby, in effect, developing the latent image on that surface. The ink is held by electrostatic forces to the heated surface as that is rotated to the ink transfer station.

At the ink transfer station, the ink, still molten on the print cylinder, and the relatively cool paper on the paper cylinder are rotated through the nip of the two cylinders. At that line of contact, there is a phase transformation of the ink which causes the ink to switch from a liquid condition to a solid condition with the result that the ink adheres firmly to the paper. This adherence and the ink phobic nature of the cylinder surface overcome the electrical forces holding the ink to the plate cylinder so that the ink releases from the print cylinder and there is a total transfer of ink where the ink contacts the paper. As a consequence the image printed on the paper wrapped around the paper cylinder, a cyan signature in this case, corresponds exactly to the electronic image impressed on the plate cylinder. Equally important, the incremental sectors of the plate cylinder rotating away from the transfer station are completely devoid of ink. These sectors may be erased by rendering them conductive thereby readying them for re-imaging and re-inking during the next revolution of the plate cylinder.

At the beginning of the next or a succeeding revolution of the plate cylinder, digital data representing a second color component or signature, e.g., the magenta component, of the same color original is applied to the write head and the ink station is controlled to present the corresponding color ink to the plate cylinder. During this second revolution of the cylinder, the system operates in exactly the same way to print the magenta color component on the same sheet of paper. Since the paper sheet remains in exactly the same place on the same paper cylinder, the second image can be superimposed on the first in exact register.

The system operates in the same way to print the yellow color component and the black component and finish coating (if desired) during succeeding revolutions of the print cylinder, after which the paper sheet, bearing a three or four-color print, protected by the finish coating may be released from the paper cylinder.

To enable my system to emulate both offset and gravure printing, the system incorporates a special write head at the write station which can impress on the surface of the print cylinder an electrostatic charge pattern which emulates electrically the copies printed by a standard high speed press. In other words, if the desired print form is screened offset printing, the charge pattern on the print cylinder can emulate the ink philic areas of a conventional offset plate which produces positive image copies composed of variable size print dots of uniform density. On the other hand, if proof copies printed in the gravure format are or interest, the charge pattern impressed on the print cylinder by the write head may emulate the three-dimensional topography of a standard gravure cylinder which produces copies composed of print dots which vary in both size and density.

The write head features one or more linear arrays of micro-tunnels aligned along the axis of the print cylinder. The tunnels are positioned so that their mouths are spaced close from the surface of the print cylinder. Positioned in each tunnel is a tiny field ignition ionization electrode which is capable of producing an ion stream which flows toward the print cylinder under the influence of an electrical potential established between the electrode and a conductive substrate of the print cylinder. This results in the build-up of a coulombic charge on the dielectric surface area of the print cylinder directly opposite the tunnel, the charged area corresponding to an image dot on the cylinder.

To regulate the magnitude of the charge on the cylinder surface at each image dot, a tiny gate electrode in the form of a ring extends around the tunnel wall near the mouth thereof. A selected potential difference is established between this gate electrode and the print cylinder substrate which allows the build-up of ionic charges on the cylinder surface opposite the tunnel until an equi-potential is attained with the gate electrode, at which point all further charging of the cylinder surface ceases. Thus, by controlling the voltage on the gate electrode at each micro-tunnel in accordance with the digital incoming data while the print cylinder is rotating, an electronic image can be written onto the print cylinder, which image consists of a multiplicity of dot areas charged to different levels in accordance with the incoming data stream. These variably charged dielectric areas or image dots acquire variable amounts of ink at the inking station which produce printing on the paper composed of print dots having variable gray scale values or color densities.

To produce image dots on the print cylinder of variable size, an aperture control conductor extends around the wall of each tunnel adjacent to the gate electrode. When a current flows though this conductor, an electromagnetic field develops around the conductor which is generally toroidal in shape and through the center of which the ion beam from the ionization electrode in that tunnel must flow in order to reach the surface of the print cylinder. As the current through that conductor is increased, the field lines extend further out from the conductor thereby decreasing the diameter of that center hole and thus the effective "aperture" of that tunnel. The present system controls the magnitudes of the currents through such conductors in the micro-tunnel array in accordance with the incoming digital data so as to vary the effective apertures of the tunnels and thus the sizes of the charged areas or image dots on the plate cylinder produced by those tunnels.

Accordingly, the present system provides for each image dot on the print cylinder both a variation in size and a variation in charge potential in response to incoming control signals which correspond to the properties of either an offset image printing structure or a gravure image printing structure. This structure will be reflected in the developed image on the plate cylinder and in the ink image transferred to the paper sheet on other printing substrate.

The printing technique described above is somewhat similar to the one disclosed in my co-pending application Ser. No. 804,220, of even date herewith, entitled Electrothermal Printing Ink With Monodispersed Synthetic Pigment Particles And Method And Apparatus For Electrically Printing Therewith, which application is hereby incorporated by reference herein. However, where that prior application concerns primarily a high-speed color offset press which feeds paper through a succession of printing sections to produce color copies, this proofing system requires only a single printing section and makes color copies on plain paper sheets by re-imaging and re-inking the same print cylinder during successive, slow revolutions of that cylinder.

Thus, this proofing application of my basic printing method, in contrast to color the press application, does not emphasis speed, but rather stresses the exactness and fidelity of image reproduction and the ability to make proof copies, in either an offset or a gravure printing format or structure which are truly representative of the copies that would be produced by an offset or gravure press controlled by the same input data delivered to my proofing system.

Also, in sharp contrast to the high-speed press described in my above-identified application, the present system requires only a single inking station to make plural color prints. This station contains an ink supply having up to four sections, each one dedicated to a different color ink and from which ink can be drawn selectively to the surface of the print cylinder as described above.

BRIEF DESCRIPTION OF THE DRAWINGS

For a fuller understanding of the nature and objects of the invention, reference should be had to the following detailed description, taken in connection with the accompanying drawings, in which:

FIG. 7 is a fragmentary diagramatic view further illustrating the operation of the write head;

DESCRIPTION OF THE PREFERRED EMBODIMENT

Figure 1:
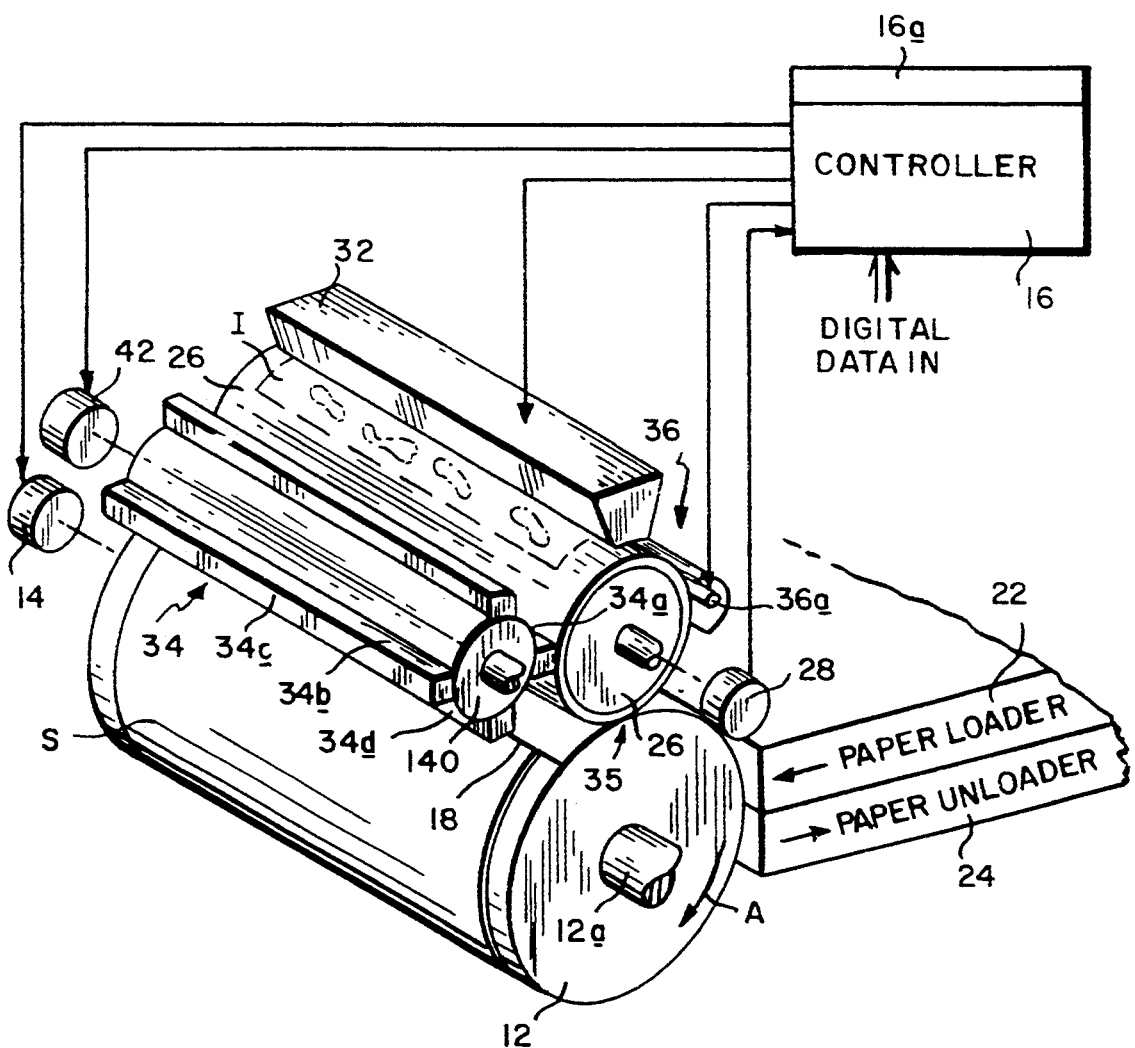
FIG. 1 is a diagrammatic view illustrating a digital color proofing system incorporating my invention.

Referring to FIG. 1 in the drawings, my system comprises a relatively large diameter paper cylinder 12 having a shaft 12a which is rotated by a step motor 14 under the control of a system controller 16. Cylinder 12 may incorporate a conventional paper pick-up clip 18 which is arranged to clamp the leading edge of a paper sheet S drawn from a paper loader 22 so that the sheet is wrapped around the cylinder when the cylinder is rotated in the direction of the arrow A. Alternatively, the sheet S may be retained on cylinder 12 by vacuum applied by suitable manifolds in the cylinder to small openings in the cylinder surface, as is well known in the art. Preferably, however, cylinder 12 incorporates special electrostatic grippers to be described which effectively route the sheet S through the system. Sheet S may be released from the cylinder by rotating the cylinder in the opposite direction with the sheet being delivered to a paper unloader 24, the paper loading and unloading operations all being under the control of controller 16. Since such paper retaining, loading and unloading mechanisms are all well-known in the art and are not part of this invention, they will not be described in detail here.

The system also includes a smaller print cylinder 26 whose shaft 25 is rotatably mounted parallel to cylinder 12 so that the surfaces of the two cylinders are in rolling contact. As will be described in detail later, the surface 26a of cylinder 26 is heated and is formed of a dielectric material. The surface of paper cylinder 12, on the other hand, is maintained at room temperature. Preferably, the two cylinders are coupled together by appropriate timing chains or gearing (not shown) so that they rotate with no slippage. The angular position or phase of roller 26 is monitored by a shaft encoder 28 coupled to shaft 25 and whose output is applied to controller 16.

Disposed around print cylinder 26, in order, are an electronic write head 32, a four-color inking head 34, a transfer station 35 constituted by the cylinder nip and an erase head 36 whose functions are controlled by controller 16.

Controller 16 receives input signals as a digital data stream representing the gray scale or color values of a color original to be proofed. Usually, the digital data will be supplied by a pre-press system as is well known in the art. However, it may also come from a color scanner or other source. In any event, the data comprises digital expressions for the color components or signatures of a color original, usually the subtractive color components cyan, magenta and yellow. In subtractive color printing, there is usually also a black component used for undercolor removal.

The data representing the various color components of the color original are applied to my system in successive strings. For example, the system may receive the data in the order cyan (C), magenta (M), yellow (Y) and then black (B). These colors differ from other electronic printing inks inasmuch they must represent key specific consumer colors, such as Bauer inks. Preferably, a mass memory 16a is associated with controller 16 for storing the relatively large amount of data necessary to operate the system In order to print on sheet S wrapped around paper cylinder 12, controller 16 controls the write head 32 so that on successive revolutions of the print cylinder 26, the write head writes on the print cylinder surface 26a electrostatic images corresponding to the four color components represented in the input data stream. That is, during the first revolution of cylinder 26, an image I representing the cyan component is applied to cylinder surface 26a. During the second or a succeeding revolution Of that cylinder, an image representing the magenta color component is impressed on that surface, and so on.

The inking head of the present system is composed of four sections 34a to 34d spaced around a common axis of rotation extending parallel to cylinder 26. The head may be rotated about that axis by a step motor 42 under the control of controller 16. Each of the sections 34a to 34b is heated and supplies, in a molten state, a special electrostatic thermoplastic ink, described in detail in my above application, in one of the four printing colors. At the beginning of each write operation on cylinder 26, controller 16 controls motor 42 to rotate head 34 to position opposite the cylinder surface 26a the head section that supplies the ink color corresponding to the image being written on the cylinder at that time. For example, when the cyan image I is being written on cylinder 26, the head section 34a which dispenses cyan ink is disposed opposite the cylinder surface 26a as depicted in FIG. 1. Resultantly, when the electrostatic image I on cylinder surface 26a is advanced past the inking head 34, liquid cyan ink C from the operative section 34a will be acquired by the charged areas of that image I, thereby developing a cyan image on surface 26a. As noted above, cylinder 26 is heated so that ink remains in a molten state on surface 26a, and adheres to the surface at those charge areas.

As will be described in more detail later, the amounts of ink C picked-up or acquired by the charged areas are proportional to the field intensities emanating from these areas. This variation of the field intensities over the image I on the print cylinder surface 26a facilitates reproduction of a full gray scale.

As the cylinder 26 continues to rotate during this first revolution of that cylinder, the developed portion of the image on the cylinder surface 26a is advanced to the ink transfer station 35 constituted by the nip formed by the cylinders 12 and 26. Controller 16 controls the position of the image I around cylinder 26 so that when that image is developed and advances through the nip, the inked image thereon is transferred to the proper location on the paper sheet S wrapped around cylinder 12. As will be seen, there is a total transfer of all of the ink from the cylinder surface 26a to the sheet S at the transfer station because the transfer is accomplished thermodynamically by means of a phase transformation of the ink which switches from a hot melt liquid condition to a solid state condition at the line of contact with the relatively cool paper sheet S.

The charged areas of the cylinder surface 26a, now devoid of ink, are advanced past erase station 36. This station contains means, such as an ultraviolet light 36a, for rendering the cylinder surface 26a conductive so that the charges thereon become dissipated. Thus, when the cylinder surface 26a exits station 36, it is completely discharged and ready for re-imaging by write head 32 during the next or a succeeding revolution of cylinder 26. In the meantime, an image representing one color component, i.e., the cyan component, of the original image will have been printed on the sheet S.

As the cylinder 26 begins the next or a succeeding revolution, controller 16 controls write head 32 in accordance with the incoming digital data so that the write head begins tow rite a second electrostatic image on the surface of that cylinder representing a second color component of the original image, e.g., the magenta component. Also, controller 16 controls motor 42 to rotate the inking head 34 so that the head section 34b, which dispenses magenta ink, is positioned opposite the print cylinder. Accordingly, when the magenta image is advanced past the inking head 34, the charged areas of the dot pattern comprising that image will acquire magenta ink from the ink head section 34b. As before, when that developed image is advanced through the ink transfer station 35 at the cylinder nip, the magenta image will be transferred to the paper sheet S. Since the two cylinders are operatively coupled together and since the laying down of the images on cylinder 26 is closely controlled by controller 16, the magenta image will be printed on sheet S in exact register with the cyan image printed thereon during the earlier revolution of cylinder 26. After advancing through the ink transfer station, the cylinder surface 26a is erased at erase station 36 and is now ready to receive an electrostatic image representing the third component or signature of the color original being proofed, i.e., the yellow component.

Two more similar printing cycles are executed for the yellow and black components, with the inking head 34 being positioned to dispense the color ink that corresponds to the color of the image being written by write head 32. Thus, after at least four revolutions of print cylinder 26, a four color print will have been printed on paper sheet S corresponding to an original color image represented by the digital data fed to controller 16.

If it is desired to provide a protective overlay for the printing, the print head 34 is provided with a fifth section (not shown) for dispensing a transparent "ink". This transparent component may be the same as the other inks but without a color pigment. To apply this protective layer, a fifth printing cycle is executed in which the signals applied by controller 16 to the write head cause the head to write on those areas written on during at least one of the four previous printing cycles. Also, controller 16 positions the inking head 34 so that the transparent ink is acquired by those areas. Thus, when that final layer is transferred to sheet S at station 35, the entire printed image will be protected under a hard, scratch-resistant barrier coating or shell. If desired, that final layer may be of a material which excludes ultra-violet light to minimize fading of the color proof.

At this point, controller 16 may deactivate the write head 32 and control motor 42 to rotate the inking head 34 to an intermediate position so that none of the head sections 34a to 34d are disposed opposite the cylinder surface 26a. Then, after the entire paper sheet S has passed through the cylinder nip for at least the fourth time, controller 16 may control motor 14 to rotate cylinder 12 in the opposite direction and, at the appropriate time, open the clip 18 so that the sheet S is released to the paper unloader 24, thereby completing the printing operation.

The present system can produce a four color proof copy in about 50 seconds. Furthermore, by exercising appropriate control over the timings of the signals applied to the write head, the system may vary the rasters and screen angles of the color components or signatures that are applied successively to paper sheet S as aforesaid. Thus, my system stresses exactness and fidelity of image reproduction in response to uniquely recorded electrostatic charge patterns on the print cylinder, rather than printing speed. Furthermore, the ink is supplied in a slow switching mode, with the different color inks being deposited and transferred successively to the paper in synchronism with the switching of the recording of the different color separation images on the print cylinder. Such features render my proofing system quite unlike conventional printing presses.

Figure 2:
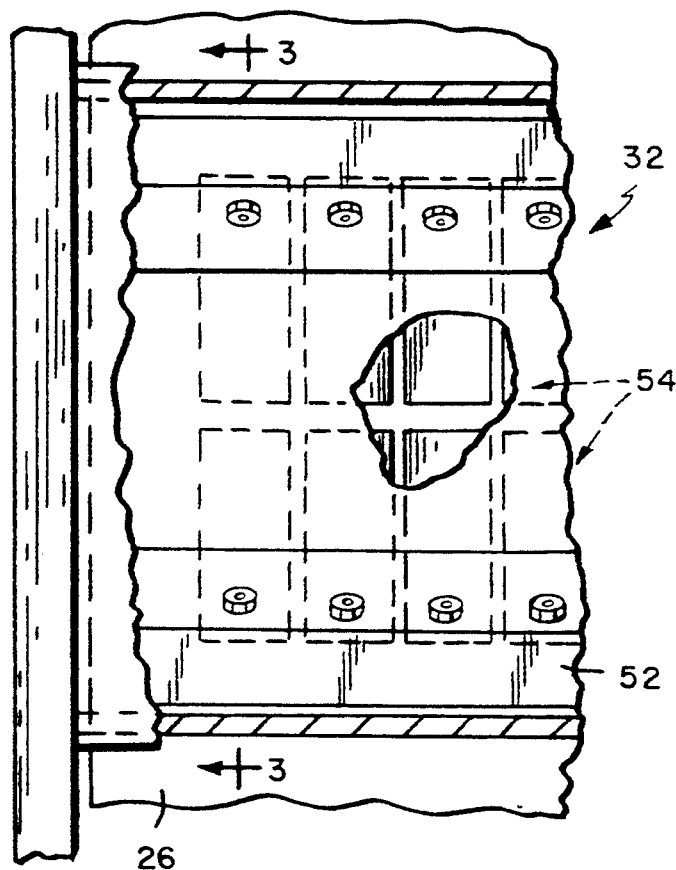
FIG. 2 is a fragmentary plan view, with parts broken away and on a much larger scale, showing the write head of the FIG. 1 system in greater detail.
Figure 3:
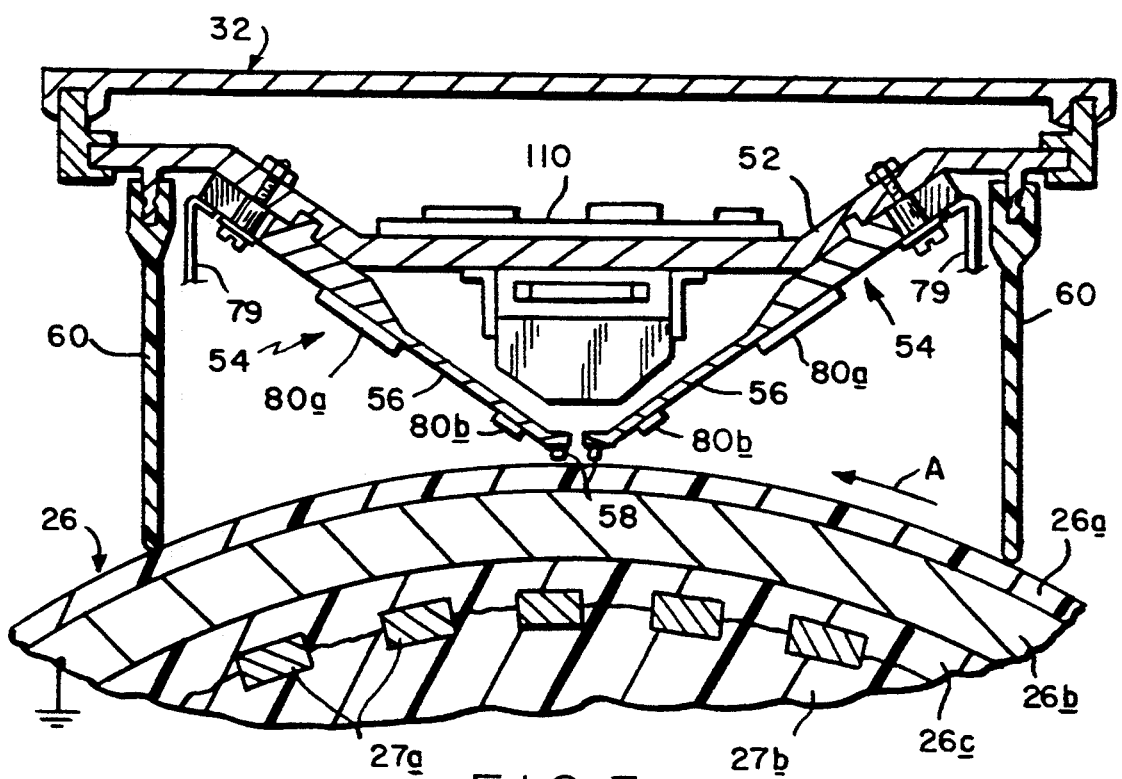
FIG. 3 is a sectional view on a still larger scale taken along line 3—3 of FIG. 2.

Referring now to FIGS. 2 and 3, print cylinder 26, which is described in detail in my above-identified application, has a thin, e.g., 1 micrometer, surface layer 26a, of a hard, heat-resistant, dielectric material such as silicon nitride. Underlying layer 26a is a somewhat thicker, e.g., 100 micrometers, conductive layer 26b which is grounded to the machine frame. Under layer 26b is a heating layer 26c. This layer may consist, for example, of a circular array of heating wires or elements 27a embedded in a body 27b of resilient electrical insulating material. Electrical connections to the heating elements may be made via slip rings (not shown) on the cylinder 26 shaft. The heating elements 27a are capable of heating the cylinder layers 26a and 26b to a temperature, e.g., 150° C., above the melting point of the inks supplied at the inking station 34.

The illustrated write head 32 comprises a stationary elongated support beam 52 spaced opposite and parallel to cylinder 26. Adjustably mounted to beam 52 is a series of emitter units 54 whose combined length is comparable to that of the cylinder. For ease of installation and to maximize the footprint available for the emitter units, these units may be adjustably mounted to bar 52 in two rows, with the units of the two rows facing toward one another as best seen in FIG. 3. This writing head is capable of writing a checkerboard pattern of image areas or dots on the print cylinder with one side of the array writing the even-numbered dots, while the other array writes the odd-numbered dots. A suitable time delay in the writing electronics allows for alignment of all the written dots in a straight line or, if desired, in a staggered arrangement.

Figure 4:
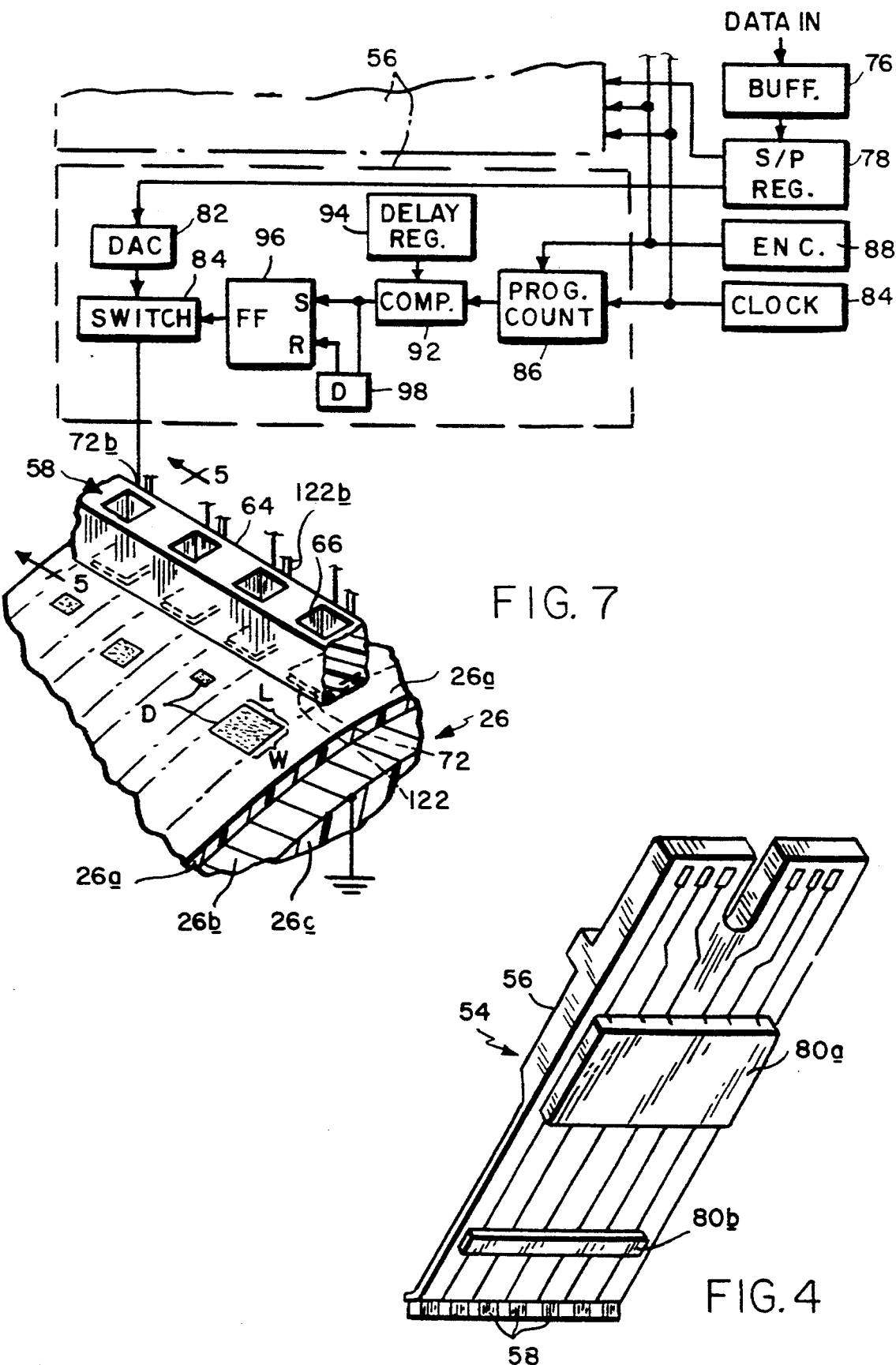
FIG. 4 is an isometric view showing a part of the FIG. 2 write head in still greater detail.

As shown in FIGS. 3 and 4, each emitter unit 54 comprises a generally rectangular, tongue-like insulating substrate or plate 56, e.g., of pressure-melt glass. Present at the underside of each substrate 56 is a plurality of tiny field-emission electrodes or electron emitters 58 whose edges project slightly from the substrate. Emitters 58 are spaced apart across one end of the substrate in a straight line. For ease of illustration, we have shown each emitter unit 54 as containing only a relatively few emitters 58. In actuality, a typical unit 54, 10 centimeters wide, may contain as many as 1000 emitters 58. The circuitry for servicing the emitters of each emitter unit 54 may be mounted directly on the unit's substrate 56 as will be described later.

As best shown in FIG. 3, a pair of flexible blades 60 extend down from beams 52 toward the print cylinder 26. The purpose of the blades is to provide a confined space around the emitter units 54 for the circulation of an inert gas, e.g., helium, to cool the units and to minimize ionization of the atmosphere surrounding emitters 58 when the print head is in operation.

Figure 5:
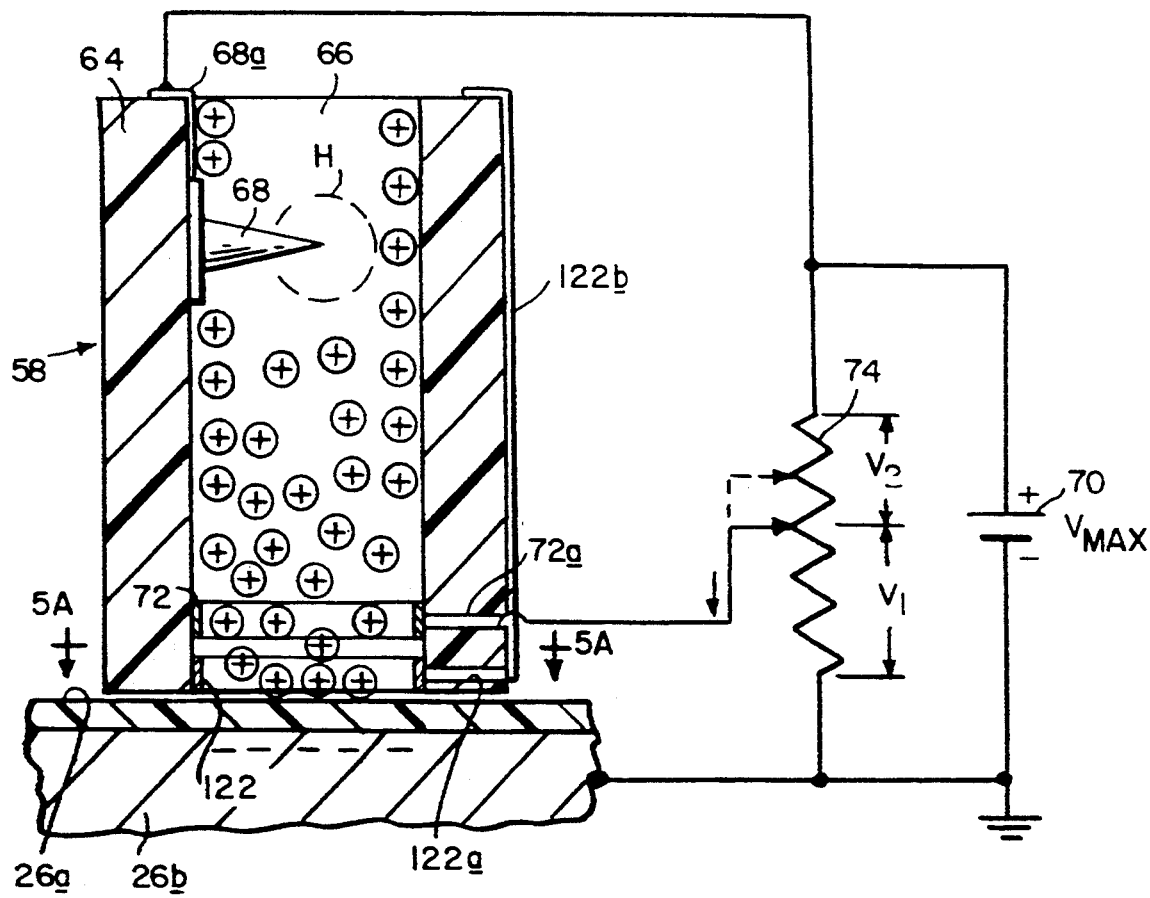
FIG. 5 is a sectional view on a much larger scale illustrating the operation of the FIG. 2 write head.
Figure 5A:
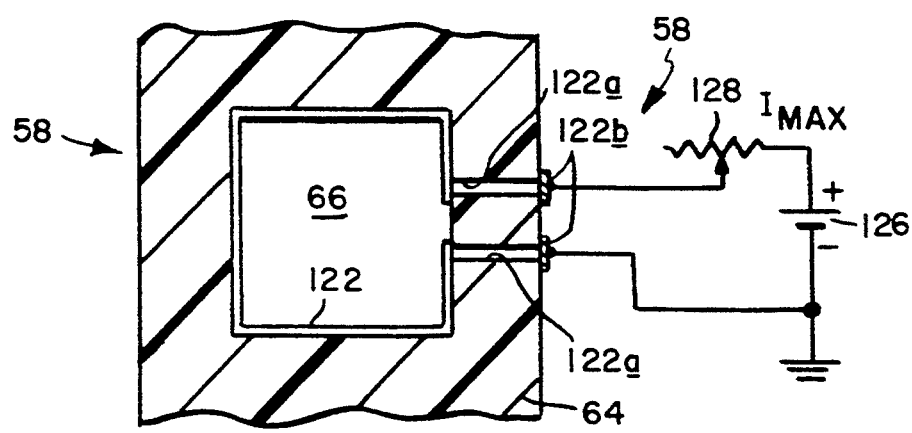
FIG. 5A is a sectional view taken along 5A—5A of FIG. 5.
Figure 6:
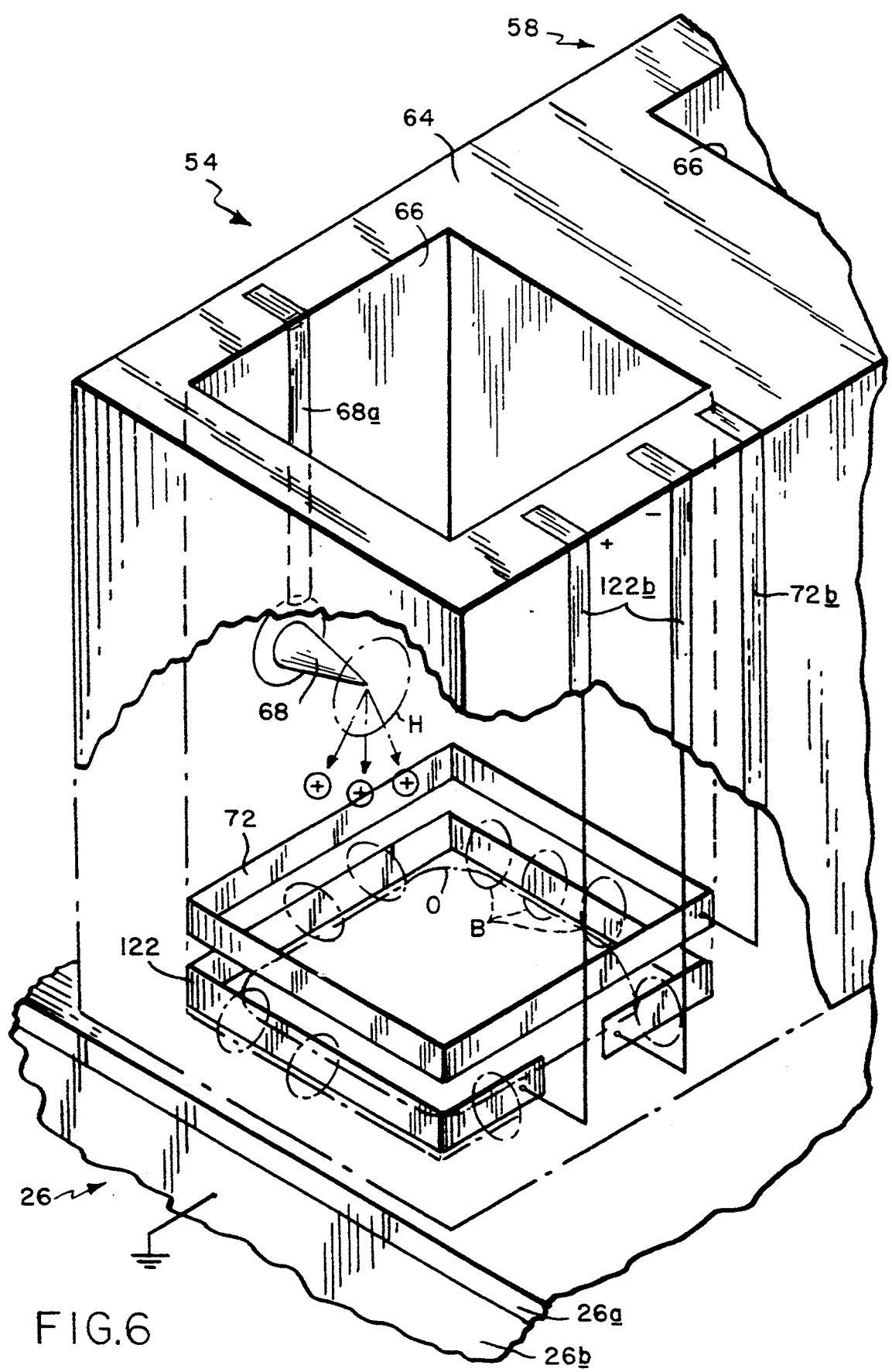
FIG. 6 is a fragmentary isometric view, on a very large scale, further illustrating the operation of the write head.

A preferred configuration for the emitters is illustrated in FIGS. 5, 5A and 6. As shown there, each emitter 58 is formed in an insulating rectangular body 64 and comprises a very small micro-tunnel 66. For example, in a proofing system capable of printing a 150 dot per inch (DPI) raster, the tunnels 66 may be only in the order of 166 micrometers on a side. Positioned in each tunnel is at least one needle electrode 68. Preferably, the electrode is mounted to a side wall of tunnel 66 and points toward the opposite wall as shown. Connections to the electrodes are established by printed conductor runs 68a extending out of the upper ends of the tunnels. Emitters 58 are all oriented with respect to the cylinder 26 so that all of the tunnels 66 extend radially toward the cylinder surface 26a like microscopic chimneys.

During a write operation, selected emitters 58 are activated by application of positive voltage pulses to the corresponding electrodes 68 of sufficient magnitude (e.g., about 400 volts DC) to cause breakdown in the associated tunnels 66. This pulse may be applied by any suitable power source, illustrated diagrammatically by a battery 70 in FIG. 5 connected between the electrode and the electrode and the conductive cylinder layer 26b, which as noted above is at electrical ground. When breakdown occurs in a tunnel 66, virtually all gas molecules in the proximity of the electrode 68 lose at least one electron under the influence of the immensely strong electrostatic field present there. These electrons are absorbed by electrode 68, causing a tiny halo H of resonating ions and free electrons to swirl around electrode 68 with intense energy. The ionic species, i.e., positive ions, tend to migrate away from electrode 68 to the lower electrical potential present at the lower end of tunnel 66 as shown in FIG. 5, where they encounter, and may be neutralized by, the prevailing current in a ring-like gate electrode 72 which extends around the wall of the tunnel 66 near the lower end or mouth thereof. Each electrode may receive such current by way of a plated via 72a extending through a wall of tunnel 66 and a printed conductor run 72b extending up along the surface of body 64 as shown in FIG. 6.

As the positive ions flow toward electrode 72, they are attracted by the electrically grounded substrate 26b of cylinder 26 which is more negative than electrode 72, and, therefore, attracts the positive ions more strongly. The necessary potential difference can be created, for example, by a simple variable voltage divider such as illustrated in FIG. 5. Specifically, a variable resistor 74 limits the voltage $V_2$ from power supply 70 that reaches gate electrode 72, but does not so limit the voltage applied to cylinder layer 26b.

The arriving ions accumulate on dielectric surface 26a until they reach a voltage potential equal to that of gate electrode 72 (higher local potentials simply result in current back flow into electrode 72, a condition which prevents their persistence). Therefore, the voltage applied to electrode 72 effectively sets the upper limit for the charge deposited on the dielectric cylinder surface 26a thereby enabling precise control of the coulombic charge density ($Q=VC$) thereon.

The tunnel 66 cross-section determines to a great extent the dimensions of a print dot Thus, an array of tunnels, rectangular in cross-section, along the longitudinal axis of the print cylinder, with individual gate electrodes 72, facilitates deposition of rectangular dot-size charge domains, each having an individual coulombic charge density as controlled by the voltage on the gate electrode 72 associated with the corresponding tunnel. These levels may be set digitally, so that individual emitters 58 are separately activated and controlled by controller 16 to produce electrostatic images, composed of imagewise patterns of charge, on the print-cylinder surface 26a.

If the gate electrodes 72 in all of the emitters 58 are set to the same voltage, the electrostatic image written on cylinder 26 will be composed of charged image areas or dots having a uniform charge density. In this event, all of these areas will pick up a uniform amount of ink from inking head 34 during the inking portion of the proofing process and the image printed on sheet S will be composed of print dots having a uniform color density. On the other hand, if different voltages are present at the various electrodes 72, corresponding to gray scale or color values of the color original being proofed, at the inking station, different amounts of ink will be picked up by the different image areas on cylinder surface 26a and the developed image transferred to sheet S will be composed of ink or print dots which vary in amounts (i.e., thicknesses) in correspondence with the corresponding color values in the original.

By offsetting the emitter 58 arrays at half-pitch, the two parallel arrays in head 32 can cover the odd and even dot positions along the cylinder surface 26a without causing detrimental separation spaces between the dots as they are charging the surface in coherent rows. These rows may be made linear by conventional delay-firing circuitry; see FIG. 7.

The control circuitry shown in FIG. 5 can set the potential of the gate electrode at each emitter 58 to any of a plurality of levels. For example, the ability to control each emitter 58 to deposit any of 32 charge densities results in the ability to create any of 32 possible field densities at each image-dot location on the cylinder surface 26a, with such fields reaching into the molten, electrostatically responsive ink from inking head 34 to capture field-intensity-proportional amounts (i.e., thicknesses) of ink. all as described in the above identified application.

Various circuits known in the art may be incorporated into controller 16 and emitter units 54 to control the operation of entire arrays of emitters 58 in accordance with an incoming digital data stream. Once such arrangement is shown diagrammatically in FIG. 7. The image data arriving on a high-speed data line from a mass memory 16a in controller 16 may be applied by way of a buffer memory 76 to a serial-to-parallel shift register 78, which distributes the data, via cables 79 (FIG. 3), to similar circuit modules 80a and 80b (FIG. 4) carried by the various emitter units 54. The circuit components on each unit may serve all of the emitters on that unit. Such modules may include a digital-to-analog converter (DAC) 82 for each emitter 58. The output of the DAC is applied to the corresponding emitter, to control the voltage on the gate electrode 72 thereof, by way of a switch 84.

Switch 84 is turned on and off at the appropriate times to enable emitter 58 to lay down an image area or dot D of a selected width W at a selected location around the print cylinder 26. For this, a master clock 84, that serves all units 54 and which may be in controller 16, applies clock signals to a program counter 86 on each unit. Counter 86 commences counting when it receives a signal from shaft encoder 28 (FIG. 1) rotated by cylinder 26, which itself rotates at a selected fixed speed. The signal from shaft encoder 28 signifies that the cylinder is at a selected phase angle, e.g., 0°. Counter 86 thus emits an output pulse to close the corresponding switch 84 when it reaches a selected count corresponding to the cylinder phase angle at which emitter 58 is to apply an image dot D to the cylinder surface 26a.

To allow the position of the image dot D to be adjusted around the cylinder to some extent for image registration, etc., the signal from counter 86 may be applied to a comparator 92 which also receives the contents of a register 94. Comparator 92 issues an output signal when the number in counter 86 equals that in register 94. Changing the number in the register shifts, around the circumference of the cylinder, the leading edge of the image dot D produced by that emitter 58. This is the left edge as viewed in FIG. 7.

The output of comparator 92 is applied to the set (S) input of a flip flop 96 and, via a delay 98, to the reset (R) input of the same flip flop so that the flip flop provides, to switch 84, an actuating signal of a fixed duration that, along with the width of the emitter tunnel 66, determines the width (W) of the image dot D laid down by emitter 58. The length (L) of the image dot is determined by the length of the emitter tunnel 66 cross-section.

For ease of illustration, the various timing and reset signals to synchronize the elements of the circuit in FIG. 7 have not been shown. They may be produced in any one of a number of ways known to those skilled in the art.

Referring now to FIGS. 5, 5A and 6, to enable write head to write electronic images on cylinder 26 composed of dots which vary in size, each emitter tunnel 66 is provided with a printed aperture control conductor 122. Each conductor 122 extends around the wall of tunnel 66 between gate electrode 72 and the mouth or lower end of the tunnel. The opposite ends of conductor 122 are connected by plated vias 122a which extend through the wall of tunnel 66 to conductors 122b printed on the outside wall of body 64 as shown in FIGS. 5A and 6.

As shown in FIG. 6, when an electric current flows through conductor 122, a electromagnetic field (B) emanates from that conductor which is generally toroidal in shape. The central opening O through that field varies in area in proportion to the magnitude of the current through the conductor 122. When a particular emitter 58 is activated, the positive ions emitted by its emitter electrode 68 must pass through that opening in order to reach the surface 26a of the plate cylinder. Ions within the opening O which do not encounter the magnetic field or which, at the edge of the opening, encounter field lines extending parallel to the motions of the ions toward surface 26a are unaffected by the field. However, those ions further away from the center of the opening O and which intercept the field lies at an angle are deflected away from the exit end of the tunnel 66, and from surface 26a, by the force (F=qvB) arising due to the motion (v) of the charge (q) through the magnetic field (B).

Thus, by controlling the current in conductor 122, the size of opening O and thus the effective aperture of the emitter 58 may be varied so as to vary the size of the image dots applied by that emitter to cylinder surface 26a. This current control may be achieved by connecting conductor 122 to a variable current source such as the one depicted diagrammatically in FIG. 5A which comprises a DC voltage source represented by a battery 126 and a variable resistor 128 connected in series with conductor 122, the other end of which is grounded.

Figure 9A:
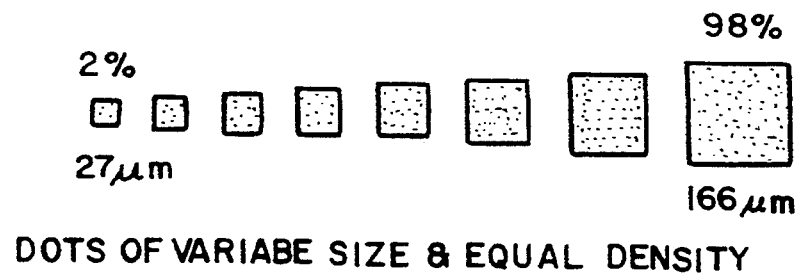
FIGS. 9A and 9B are diagrammatic views further illustrating the operation of the system.
Figure 9B:

If uniform currents are applied to all of the aperture control conductors 122 in the various emitters 58, the sizes of the image areas or dots D laid down on print cylinder 26 will be the same. On the other hand, if different currents are applied to the different conductors 122, the sizes of those image areas D will vary as depicted in FIGS. 7 and 9A.

Figure 8:
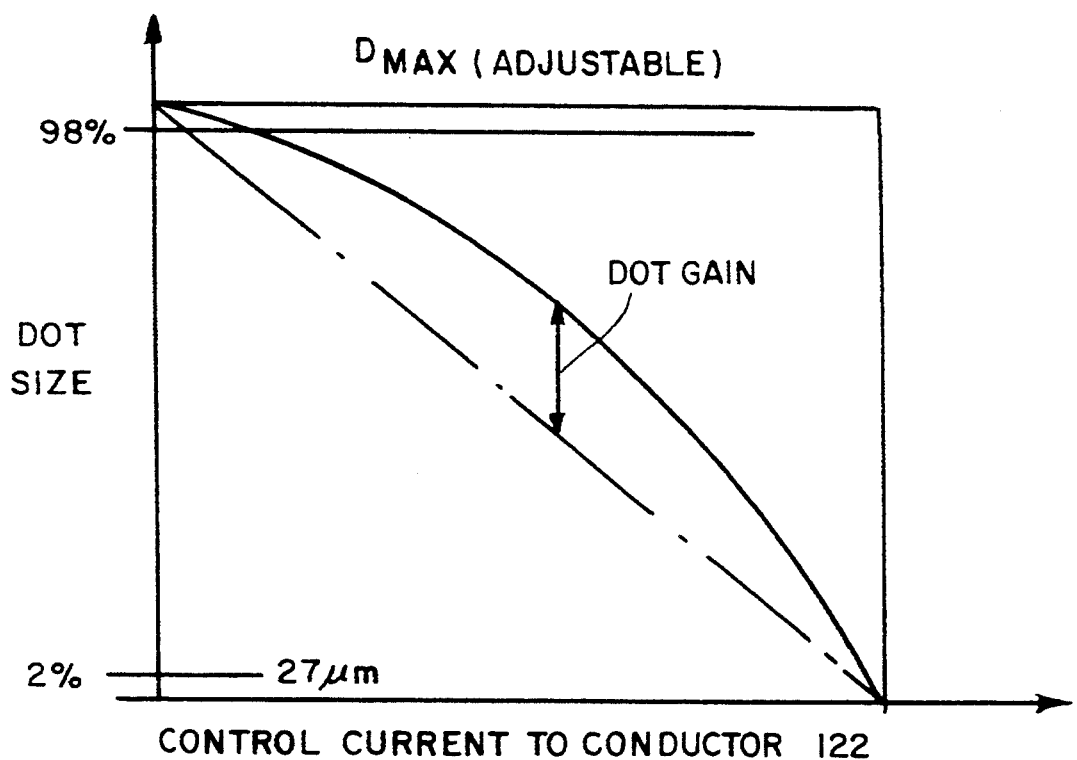
FIG. 8 is a diagrammatic view showing the variation in print dot charge with gate electrode control voltage in the write head.

A typical proofing system may provide for the ability to controllably restrict the effective aperture of each emitter 58 to permit passage to the plate cylinder surface 26a of as many as 98% or a few as 2% of the ions, dimensionally speaking, in terms of charge deposition on the cylinder surface 26a. Thus, in the case of a system which prints a 150-line raster using emitters 58 which have tunnels 66 which are 166 micrometers on a side, the image areas D laid down on the plate cylinder may be as small as 27 micrometers or as large as 140 micrometers on a side, as depicted in FIGS. 8 and 9A. Thus, for example, if the system has the ability to apply 32 different current levels to the aperture control conductors 122 in the various emitters 58, the image areas D written on the plate cylinder may have up to 32 different sizes within that size range.

Various circuits known in the art may be incorporated into the system to control the currents in the conductors 122 of entire arrays of emitters in accordance with the incoming digital data. One such arrangement may be similar to the one depicted in FIG. 7, but with a current DAC being used in lieu of DAC 82 there, the output of the current DAC being switched by switch 84 to one end of conductor 122.

As seen from the foregoing, then, the ring electrode 72 of each emitter 58, alone, allows the choice of the charge intensity level at each dot position on the print cylinder so that the later ink deposition by the inking head 34 can be controlled to attain the desired uniform color density that an offset press typically produces. On the other hand, the ring electrode 72 and the aperture conductor 122, acting in concert, allow the emulation of the variable size/variable density print dots produced by gravure printing, hence meeting the requirement of a proofing operation for a gravure press.

Figure 10:
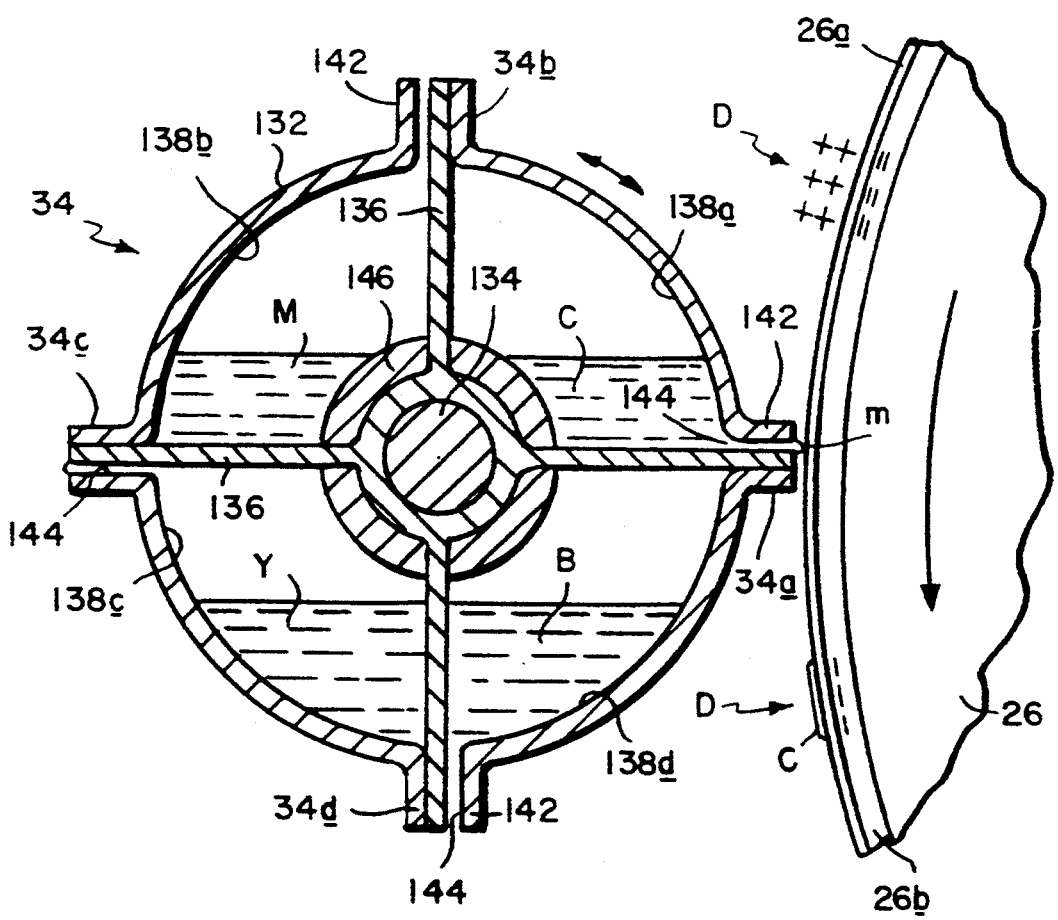
FIG. 10 is a sectional view showing in greater detail the inking station of the FIG. 1 system.

Refer now to FIG. 10 which shows the inking station 34 in greater detail. It comprises a hollow thermally conductive roll or tube 132 having an axle 134 which extends parallel to cylinder 26 and is rotatable by motor 42 (FIG. 1). The space inside roll 132 is divided by partitions 136 into four equal-size ink storage chambers 138a to 138d, the ands of those chambers being closed by suitable end plates 140 (FIG. 1).

Formed at the periphery of roll 132 adjacent to each partition 136 is a radial, outwardly extending lip 142. Lip 142 is spaced slightly from the adjacent partition to provide a lengthwise slit 144 which communicates with the interior of the adjacent chamber so that the ink in that chamber, when liquid, can flow into that slit. Roll 132 can be rotated in either direction by motor 42 under the control of controller 16 so that the slit 144 of each inking head section 34a to 34d can be positioned directly opposite plate cylinder 26, i.e., in the position of slip 144 of section 34a depicted in FIG. 10. When the lip is in that position, the mouth of the corresponding slit 144 is spaced very close from the cylinder surface 26a. The roll can also be located at intermediate positions so that no head section is disposed opposite cylinder 26.

Heaters 146 are provided inside roll 132 for maintaining the temperature of the inking head, including the lips 142, above the melting point of the thermoplastic inks contained therein, e.g., above 150° C. Power to the heaters 146 may be provided by way of slip rings (not shown) on axle 134. Also, suitable access openings (not shown) may be provided in an end plate 140 to refill the ink chambers with ink.

When heaters 146 are energized, the inks C, M, Y and B in chambers 138a to 138d, respectively, remain liquid and are able to flow to the mouths of the various slits 144 to form lengthwise meniscus m which protrude from the mouths of slits 144. When one of those slits is located opposite cylinder 26, the ink meniscus m protruding therefrom just kisses the cylinder surface 26a with a steady contact, as shown in FIG. 10.

During printing, as the charged cylinder surface 26a rotates past the operative inking head section, e.g., section 34a in FIG. 10, the charged image areas or dots D attract and hold, via their respective outreaching electrostatic fields, molten ink from the ink meniscus m contacting the surface 26a. However, due to the mildly ink-repellent nature of surface 26a, that ink does not wet or transfer spontaneously to uncharged areas of the cylinder surface.

As described in detail in my above-identified application, during this ink transfer step, it is both the dielectric carrier material comprising the special ink and the charged particles therein (which are attracted as a composite liquid matrix to the image areas D) that serve as the ink transport agent. That is, in the presence of the field at each image area, the molecular structure of the carrier forms chains of dipoles oriented along the electric field lines emanating from the plate cylinder. These dipoles interact with the charges in the ink particles so that those charges reorient to accommodate to the polarity of the field lines. In other words, if there is a positive ionic charge on the surface of the print cylinder as shown in FIG. 10, the carrier dipoles orient themselves along the field lines to present their negative poles to the cylinder surface. The particles dispersed in the carrier likewise become polarized to conform to and propagate the field pattern, thereby becoming electrostatically bound to the carrier so that the ink carrier material and particles transfer together in a fixed ratio to the cylinder surface 26a.

The ink volume, (i.e., depth, which translates into thickness on cylinder surface 26a), of the matrix that is attracted to a particular image area or dot D on plate cylinder surface 26a depends on the magnitude of the electrostatic field at that area. In other words, the principle of physics at work is not charge compensation, but rather field neutralization through an interacting matrix of particles and carrier material. This ability to produce different thicknesses of ink deposits within the boundaries of each image area of dot D by varying the field intensity at each dot facilitates the generation of a gray scale for each dot ranging from 0 to 2.0 reflection density, approximating the gray scale of a standard photographic film.

Because of the dipole affinity that exists between the particles and the carrier material comprising the ink, a fixed amount of carrier accompanies each particle as the ink is deposited onto surface 16, thereby also preserving without depletion the two components in the same ratio within the ink remaining in the slit 144. The cohesion of the carrier material and its surface tension also facilitates the maintenance and regeneration of a fresh ink meniscus m at the mouth of slit 144 after ink is withdrawn from the slit, as these forces within the molten ink combine to close in and fill the void in the body of ink remaining in the slit.

Once the different amounts of ink are acquired by the plate cylinder surface 26a, since that surface is heated as described above, the ink remains in its molten state as it is transported to the ink transfer station 35 (FIG. 1). At that transfer station, the paper sheet S is mildly pressed against surface 26a to form the image pattern on sheet S. During this transfer step, the ink carrier material serves as the transport agent to effect transfer of the ink to sheet S, which unlike the plate cylinder surface, is not heated and remains generally at room temperature.

The ink at each dot position may not solidify throughout instantaneously; the rate of solidification depends on the size of the ink "bite" at that image dot. For example, if the amount of ink adhering to a particular image dot on cylinder 26 is relatively small (i.e., it corresponds to the low end of the gray scale), as soon as that "thin" ink spot is brought into contact with the paper sheet S, it will cool and solidify throughout its entire thickness and will thus offset completely from the print cylinder 26 to sheet S as it leaves the nip of the plate and paper cylinders.

However, if a relatively large amount of ink is present at a given image dot on cylinder 26, only the surface of that ink spot will solidify upon contact with the relatively cool sheet S. For complete transfer of ink from cylinder 26 to sheet S, it is essential, then, that at the point of transfer, the cohesion force of the ink equal or exceed the difference between the adhesion force that adheres the ink to sheet S and the electrostatic force that adheres the ink to the cylinder surface 26a, for all ink-spot thicknesses representing the full gray scale being printed. These characteristics of the ink, the image cylinder and the sheet S assure that ink deposits having different thicknesses will be plastic or compliant enough to accommodate the change in the spacing of the moving cylinder and sheet S surfaces that occurs during transfer, yet cohesive enough to offset completely to the sheet S.

Figure 11:
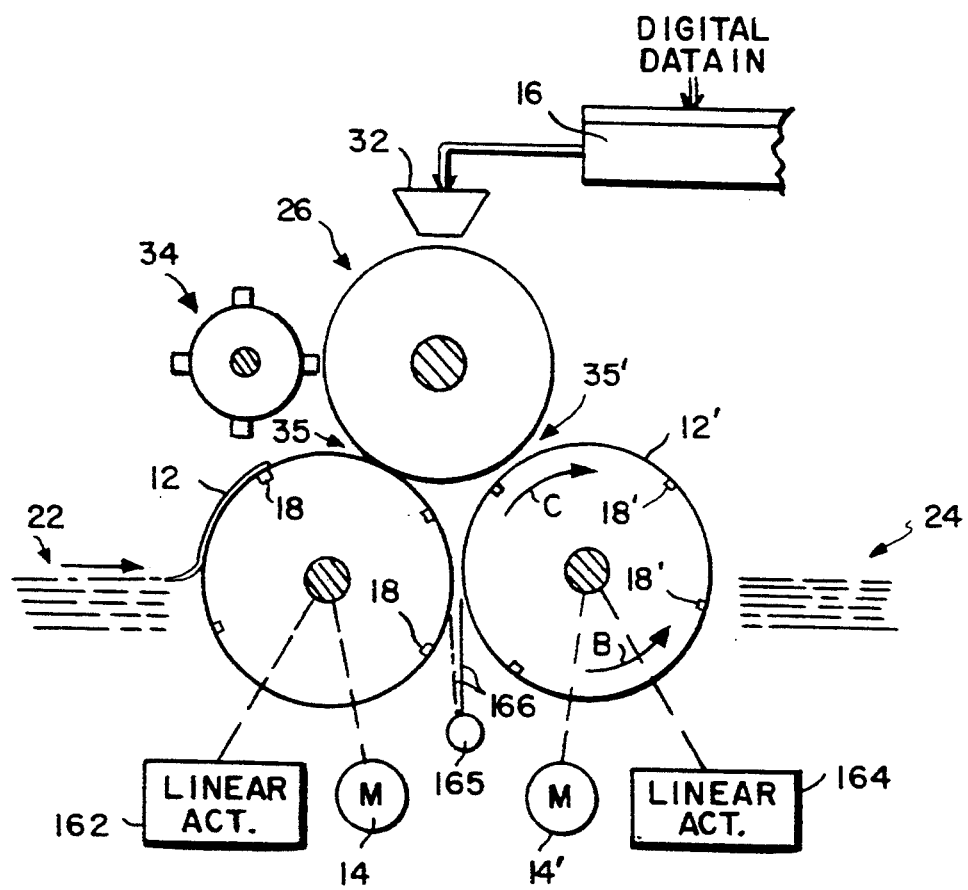
FIG. 11 is a diagrammatic view of a system for producing two-sided proofs.

Refer now to FIG. 11 which shows a system for producing two-sided proofs. It is similar to the FIG. 1 system and corresponding parts bear the same identifying numbers.

In the FIG. 11 system the loader 22 and unloader 24 are positioned on opposite sides of the print cylinder 26. To unload sheet S, it is handed off to an auxiliary rotatable paper cylinder 12' which extends parallel to cylinder 12. Cylinder 12' has grippers 18' similar to grippers 18 on cylinder 12 and may be rotated in either direction by a motor 14' under the control of controller 16. Each cylinder 12 and 12' is mounted so that it can be moved between an operative position in which it is in rolling contact with cylinder 16 and a retracted position wherein it is spaced slightly from the print cylinder. The two cylinders 12 and 12' are moved between their respective positions by linear actuators 162 and 164 under the control of controller 16. The two cylinders are operated out of phase by the controller so that when cylinder 12 is in contact with cylinder 26, the auxiliary cylinder 12' is retracted away from cylinder 26 as in FIG. 11, and vice versa.

When picking up a sheet S from cylinder 12, cylinder 12' is rotated in the direction of arrow B. As the leading edge of sheet S advances to an appropriate location between the two cylinders, controller 16 activates a rotary solenoid 165 which swings a gate 166 from its solid line position in FIG. 11 to a position against cylinder 12 shown in phantom in that figure.

At the same time, controller 16 deactivates the appropriate grippers 18 on cylinder 12 and activates the grippers 18' on cylinder 12' so that the leading edge of sheet S is stripped from the former cylinder and picked up by the latter cylinder as that continues to rotate. After at least a full revolution of cylinder 12', sheet S is wrapped around that cylinder with its back or unprinted side now facing the print cylinder 26. At this point, the controller 16 may reverse motor 14' so that cylinder 12' rotates in the direction of arrow C. Resultantly, the former trailing, now leading, edge of sheet S will be advanced toward paper unloader 24. At the appropriate time, controller 16 may deactivate grippers 18' to release the sheet S to unloader 24.

On the other hand, if a two-sided proof is to be made, rather than releasing the sheet to unloader 24, controller 16 commands motor 14' to continue rotating in the direction of arrow C and maintains grippers 18' in their active condition. The controller also issues a control signal to actuator 162 which retracts cylinder 12 away from cylinder 26. Another similar signal to actuator 164 causes that actuator to advance cylinder 12' into rolling contact with the print cylinder.

As soon as sheet S was handed off to auxiliary cylinder 12', controller 16 began controlling the write head 32 to commence writing the first color component of the image to be printed on the back side of sheet S. Also, the controller positioned the inking head 34 so as to dispense inks corresponding to the color of the image then being written on cylinder 26. From this point on, the copier operates as described above when printing on one side only, except that the ink transfer step occurs at the nip of cylinders 12' and 26.

After at least four revolutions of cylinder 26, a four color image will have been printed on the back side of sheet S at which point the controller 16 may issue control signals to the grippers 18' on cylinder 12' and to paper unloader 24 so that the next time the leading edge margin of sheet S is uppermost on cylinder 12', it is handed off to unloader 24 and exists the system.

As noted above, various means such as clips and vacuum ports have been used to hold a paper sheet to a rotating cylinder and to grip and release the sheet. While the conventional hold-down mechanisms or grippers do perform those functions effectively, they do require that openings such as longitudinal slots or lines of holes be formed in the surface of the cylinder. Such openings can cause paper hang-ups and jams. Also, the requirement for such openings limits the flexibility of the cylinder in terms of when, during a particular revolution, a cylinder can pick up or hand off different size sheets of paper. In other words, the number of slots or lines of holes that can be formed around a particular cylinder and serviced in order to operate properly is limited.

Figure 12:
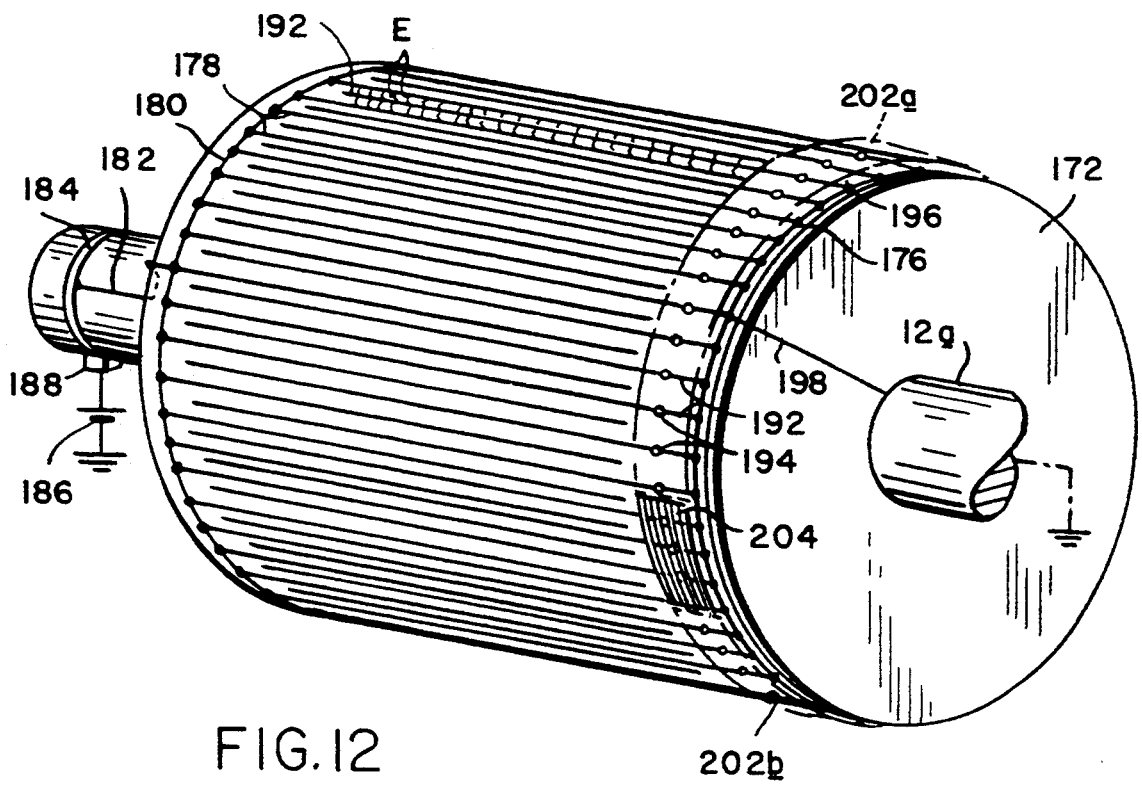
FIG. 12 is a similar view of a paper cylinder for the proofing system which incorporates special electrostatic paper grippers.

For these reasons among others, applicant has devised a completely different electrostatic paper gripper or hold-down mechanism 18, depicted in FIG. 12, which does not require any openings at all in the cylinder surface and which can be packed relatively densely around the circumference of the cylinder, thereby allowing much greater flexibility in the handling of the sheets of paper being printed on during operation of the copier.

As shown in FIG. 12, cylinder 12 (and cylinder 12') comprises a core 172 which is concentric to shaft 12a. Surrounding core 172 is a relatively thin layer 176 of a hard dielectric material such as silicon nitride.

Embedded in layer 176 is a set of thin parallel wires 178 which extend along cylinder 12 and are connected to a common circumferential conductor 180 embedded in layer 176 adjacent to the left end of cylinder 12. Conductor 180 is, in turn, connected by a suitable insulated lead 182 to a slip ring 184 encircling the left end segment of shaft 12a. That ring is connected electrically to a DC voltage source, represented by a battery 186, by means of a conventional brush 188. Interlaced with wires 178 is a second set of similar wires 192 which are connected via separate photoresistors 194 to a second embedded circumferential conductor 196 near the right end of cylinder 12. Conductor 196 is, in turn, connected by a lead 198 to shaft 12a which is grounded. Photoresistors 194 are located at an end segment of cylinder 12 not covered by paper sheet S, e.g., beyond the end of the print cylinder 26.

Normally, no current flows along wires 192 because the photoresistors are usually essentially non-conducting. However, when a photoresistor is exposed to light, its resistance is lowered so that a potential difference exists between the corresponding wire 192 and the adjacent wires 178 on each side of that wire 192. These contiguous conductors of opposite polarity produce contiguous electrostatic fields E which protrude from the dielectric layer 176 all along cylinder 12. These fields induce corresponding capacitive charges in those portions of sheet S positioned opposite the fields since the paper sheet S is of a dielectric material. This give rise to attractive electrostatic forces which are strong enough to hold the sheet S to the cylinder surface.

In other words, each energized wire 192 and its adjacent wires 178 constitute a gripper 18 (FIG. 2). The various grippers 18 (i.e., wires 192) are activated and deactivated at the appropriate times by strategically placed stationary light sources 202 and masks 204 spaced close from photoresistors 194 at different sectors around cylinder 12 (and cylinder 12'). Sources 202 may be arcuate arrays of tiny light-emitting diodes (LEDs) whose operations are controlled by controller 16 to execute the various paper handling routines, e.g., load, unload, transfer to cylinder 12', etc.

FIG. 12 shows the positions of the light source arrays 202 and mask 204 adjacent to paper loader 22 that operate to pick up a sheet S from the loader. When the loader feeds a sheet to cylinder 12, it issues a signal to controller 16 which thereupon turns on a LED array 202a which extends around cylinder 12 from about nine o'clock to almost three o'clock (referring to FIG. 2) and a second LED array 202b which extends from about three o'clock to eight o'clock. Preferably, a mask 204 exists between the ends of the two arrays between eight and nine o'clock to provide a sharp paper transfer or gripping line where cylinder 12 picks up the sheet from loader 22. There may be a similar mask between the opposite ends of the two arrays. LED arrays 202a and 202b remain illuminated all the while sheet S on cylinder 12 is being printed on.

When the time comes to release the sheet from cylinder 12 either to unload the sheet or to print a two-sided copy, controller 16 turns off LED array 202b and turns on the two LED arrays (not shown) opposite cylinder 12' that are comparable to arrays 202a and 202b, thereby to activate the grippers 18' of cylinder of 12'. When the leading edge of sheet S is advanced beyond the end of array 202a, the photoresistors controlling the wires 192 underlying that edge no longer receive light because array 202b is off. Consequently, that edge margin is no longer held to cylinder 12. Rather it is now influenced by the electrostatic fields emanating from cylinder 12' whose grippers 18', as noted above, have been activated. Resultantly, sheet S is handed off from one cylinder to the other as described above. A short time later, controller 16 turns off LED array 202a.

Controller 16 operates in the same manner to turn on and off the similar LED arrays that operate the photoresisters on cylinder 12' so that the grippers 18' of that cylinder hold sheet S while the sheet is being printed on and hand off the sheet to the paper unloader 24 at the end of a printing operation. A mask similar to mask 204 may be present from three to four o'clock at cylinder 12' to define a sharp paper release line at the unloader.

It will be seen from the foregoing, then, that my proofing system allows the production of high quality proof copies of color originals which may emulate the printing structure of either offset printing or gravure printing so that the copies are truly representative of the press copies that will ultimately be printed using the same input data. It must be stressed also that proofs can be produced on the actual press paper and/or on plastic coated papers, clear plastic and even metal. This truly important feature does not exist in any other digital proofing system of which we are aware. Using the proof copies, adjustments can be made at the pre-press stage of printing which will provide more quickly and efficiently the corrections necessary to achieve the desired effects in the final copies printed by the press. While having all of the above advantages, my system is still relatively compact and simple to operate. Therefore it should find wide acceptance by the printing industry.

It should also be appreciated that the objects set forth, among those made apparent from the proceeding description, are efficiently attained, and, since certain changes may be made in the above method and in the above construction without departing from the scope invention, it is intended that all matter contained in the above description or shown in the accompanying drawings shall be interpreted as illustrative and not in a limiting sense.

It is also to be understood that the following claims are intended to cover all of the generic and specific features of the invention described herein.

I claim:

1. A proofing system comprising
an image member having a dielectric outer surface and a continuous conductive layer under said outer surface;
a write head for writing a pattern of electrostatic image dots on said outer surface, said write head including
an array of at least one micro-tunnel, each micro-tunnel having a mouth disposed opposite said outer surface and a wall defining each micro-tunnel,
a field emission ionization electrode in each micro-tunnel,
a gate electrode extending around the wall of each micro-tunnel near the mouth thereof, and
an aperture electrode extending around the wall of each micro-tunnel near the mouth thereof;
means for providing a potential difference between each ionization electrode and said conductive layer so that ions are produced which propagate as a tiny beam toward said outer surface;
first control means responsive to incoming digital data representing an original document for providing a variable potential difference between each gate electrode and said conductive layer thereby to charge said outer surface opposite the mouth of each micro-tunnel to a variable charge level to produce a pattern of image dots on said outer surface having variable field strengths;
second control means responsive to said incoming digital data for providing a variable current flow in each aperture electrode which varies in accordance with said digital data so as to provide a variable electromagnetic field at the mouth of each micro-tunnel which controls the ion beam propagating from each micro-tunnel to produce a pattern of image dots of each outer surface having variable dot sizes;
means for presenting electostatic ink to said surface whereby said surface acquires ink only at the image dots thereon in amounts proportional to the field strengths of the image dots;
support means for supporting a printing substrate, and
means for pressing said surface and said substrate together so that the ink is released from said surface to the substrate thereby producing a proof copy of the original document consisting of a pattern of print dots with variable gray scale values and sizes.

2. A proofing system comprising
an image member having a dielectric outer surface and a continuous conductive layer under said outer surface;
a write head for writing a pattern of electrostatic image dots on said outer surface, said write head including
an array of at least one micro-tunnel each micro-tunnel having a mouth disposed opposite said outer surface and a wall defining each micro-tunnel,
a field emission ionization electrode in each micro-tunnel, and
an aperture electrode extending around the wall of each micro-tunnel near the mouth thereof;
means for providing a potential deference between each ionization electrode and said conductive layer so that ions are produced which propagate as a tiny beam toward said outer surface;
control means responsive to said incoming digital data for providing a variable current flow in each aperture electrode which varies in accordance with said digital data so as to provide a variable electromagnetic field at the mouth of each micro-tunnel which controls the ion beam propagating from each micro-tunnel so as to produce a pattern of image dots on said outer surface having variable dot sizes;

means for presenting electrostatic ink to said surface whereby said surface acquires ink only at the image dots thereon in amounts proportional to the field strengths of the image dots;

support means for supporting a printing substrate, and means for pressing said surface and said substrate together so that the ink is released from said surface to the substrate thereby producing a proof copy of the original document consisting of a pattern of print dots with variable sizes.

3. The system defined in claim 2 wherein said image member outer surface is slightly ink phobic.

4. A proofing system comprising an image member having a dielectric outer surface and a continuous conductive layer under said outer surface;

means for writing a pattern of electrostatic image dots on said surface, said writing means including an array of at least one micro-tunnel, each micro-tunnel having a mouth disposed opposite said outer surface and a wall defining each micro-tunnel, a field-emission ionization electrode in each micro-tunnel, and a gate electrode extending around the wall of each micro-tunnel adjacent to the mouth thereof;

means for providing a potential difference between each ionization electrode and said conductive layer so that ions are produced by each ionization electrode which propagate as a tiny beam toward said outer surface;

control means responsive to digital data representing an original document for applying a variable potential difference between each gate electrode and said conductive layer which varies in accordance with said digital data representing an original thereby to charge said outer surface opposite the mouth of each micro-tunnel to a variable charge level which produces a pattern of image dots on said outer surface having variable field strengths;

means for presenting an electrostatic ink to said outer surface whereby said outer surface acquires ink only at the image dots thereon in amounts proportional to the field strengths of the image dots;

support means for supporting a printing substrate;

means for pressing said surface and the substrate together so that the ink is released from said surface to the substrate thereby producing a proof copy of the original document consisting of a pattern of dots, and electromagnetic means at each micro-tunnel for controlling the image dot written in said outer surface by each micro-tunnel in accordance with the digital data so that said proof copy is composed of print dots having variable gray scale values and variable sizes.

5. The system defined in claim 4 wherein the image member outer surface is slightly ink phobic.

6. The system defined in claim 4 wherein the digital data includes data representing a plurality of color signatures comprising an original document in color so that the latent images representing said plurality of signatures are written successively on said surface with each image replacing the image previously written on said surface;

said ink presenting means present selectively to said surface different color inks in response to ink control signals;

control means for issuing ink control signals to the ink presenting means so that the ink presenting means present to the surface of color inks that correspond to the colors of the signature represented by the latent image then being written on said surface.

7. The system defined in claim 4 wherein the image member is a print cylinder rotatable about an axis and having an outer cylindrical surface which constitutes said dielectric outer surface;

the substrate supporting means is a paper cylinder rotatable parallel to the print cylinder and around which the substrate may be wrapped;

the pressing means comprise means for rotating the cylinders so that the substrate is in rolling contact with said surface;

a first latent image representing a first color signature of the original document is written on said surface during one revolution of the print cylinder and a second latent image representing a second color signature of the original document is written on said surface during a succeeding revolution of the paint cylinder, and said ink presenting means present, during said one and succeeding revolutions of the print cylinder, inks whose colors correspond to said first and second signature colors, respectively, so that after said succeeding revolutions of the print cylinder, said substrate carries two print dot patterns of different colors which combine to produce a plural color copy of the original document.

8. The system defined in claim 4 wherein the dot area controlling means comprise a conductor extending around the wall of each micro-tunnel adjacent to the mouth thereof;

a current supply for each conductor, and means for controlling the current supplied to each conductor to form an annular electromagnetic field in each micro-tunnel having a variable size aperture through which the ions in said micro-tunnel must pass in order to charge said outer surface.

9. The system defined in claim 4 wherein the support means include a surface which supports the substrate, and means for holding the substrate to the support means surface electrostatically.

10. The system defined in claim 4 wherein said presenting means present a thermoplastic ink which assumes a liquid state above a selected temperature, and further including means for heating said presenting means so that said ink is acquired as a liquid by said image member surface and remains a liquid thereon until said ink is released to said substrate.

11. The system defined in claim 4 wherein the ink is a transparent material that provides a hard scratch-resistant overlay for the printing on the substrate.

12. Reproduction apparatus comprising an image member having a dielectric outer surface and a continuous conductive layer under said outer surface;

means for writing a pattern of electrostatic image dots on said surface, said writing means including an array of at least one micro-tunnel, each micro-tunnel having a mouth disposed opposite said outer surface and a wall defining each micro-tunnel, and a field-emission ionization electrode in each micro-tunnel;

control means responsive to digital data representing an original document for providing a variable potential difference between each ionization electrode and said conductive layer which varies in accordance with said digital data representing an original document so that ions are produced by each electrode which propagate as a tiny beam and charge said outer surface opposite the mouth of each micro-tunnel to produce a pattern of image dots on said outer surface;

electromagnetic means at each micro-tunnel for controlling the image dots written on said outer surface in accordance with the digital data so that the image dots have variable sizes;

means for presenting an electrostatic ink to said outer surface whereby said outer surface acquires ink only at the image dots thereon;

support means for supporting a printing substrate, and means for pressing said outer surface and said support means together so that the ink may be released from said outer surface to a substrate on said support means thereby producing a copy composed of print dots having variable sizes.

13. The apparatus defined in claim 12 wherein said image member outer surface is slightly ink phobic.

14. The apparatus defined in claim 12 wherein said presenting means present a thermoplastic ink which assumes a liquid state above a selected temperature, and further including means for heating said presenting means so that said ink is acquired as a liquid by said image member outer surface and remains a liquid thereon until said ink is released to said substrate.

15. The apparatus defined in claim 12 wherein the dot area controlling means comprise a split ring conductor extending around the wall of each micro-tunnel adjacent to the mouth thereof;

a current supply for each conductor, and means for controlling the current supplied to each conductor to form an annular electromagnetic field in each micro-tunnel having a variable size aperture through which the ions in each micro-tunnel must pass in order to charge said image member outer surface.

* * * * *